(12) United States Patent
Bowles et al.

(10) Patent No.: US 9,891,244 B2
(45) Date of Patent: *Feb. 13, 2018

(54) MICROELECTRONIC PACKAGES HAVING SPLIT GYROSCOPE STRUCTURES AND METHODS FOR THE FABRICATION THEREOF

(71) Applicants: Philip H. Bowles, San Diego, CA (US); Stephen R. Hooper, Mesa, AZ (US)

(72) Inventors: Philip H. Bowles, San Diego, CA (US); Stephen R. Hooper, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 898 days.

This patent is subject to a terminal disclaimer.

(21) Appl. No.: 14/460,795

(22) Filed: Aug. 15, 2014

(65) Prior Publication Data

US 2017/0038209 A1  Feb. 9, 2017

(51) Int. Cl.
| | |
|---|---|
| G01P 15/18 | (2013.01) |
| B81B 7/00 | (2006.01) |
| B81C 3/00 | (2006.01) |
| G01P 15/08 | (2006.01) |
| G01C 19/5783 | (2012.01) |

(52) U.S. Cl.
CPC ............ G01P 15/18 (2013.01); B81B 7/0074 (2013.01); B81C 3/001 (2013.01); G01C 19/5783 (2013.01); G01P 15/0802 (2013.01); *B81B 2201/0235* (2013.01); *B81B 2201/0242* (2013.01); *B81B 2203/0315* (2013.01); *B81B 2203/051* (2013.01); *B81B 2203/053* (2013.01); *B81C 2203/0109* (2013.01); *B81C 2203/0118* (2013.01)

(58) Field of Classification Search
CPC ............ G01C 19/5733; G01C 19/5769; G01C 19/5712; G01C 19/5755; G01P 15/123; G01P 15/18; G01P 15/0802; G01P 1/02; G01P 1/023

See application file for complete search history.

(56) References Cited

U.S. PATENT DOCUMENTS

| | | | |
|---|---|---|---|
| 6,846,725 B2 | 1/2005 | Nagarajan et al. | |
| 7,552,636 B2* | 6/2009 | Datskos ................. | B82Y 15/00 73/504.04 |
| 8,250,921 B2 | 8/2012 | Nasiri et al. | |

(Continued)

FOREIGN PATENT DOCUMENTS

CN    101643193 A    2/2010

OTHER PUBLICATIONS

NPL_Application_14057262_20131018_MT12243ZK_038-0594.
NPL_Application_14230273_20140331_MT12235ZR_038-0595.

*Primary Examiner* — Helen Kwok

(57) ABSTRACT

Methods for fabricating microelectronic packages and microelectronic packages having split gyroscope structures are provided. In one embodiment, the microelectronic package includes a first Microelectromechanical Systems (MEMS) die having a first MEMS gyroscope structure thereon. The microelectronic package further includes a second MEMS die, which has a second MEMS gyroscope structure thereon and which is positioned in a stacked relationship with the first MEMS die. The first and second MEMS gyroscope structures overlap as taken along a first axis orthogonal to a principal axis of the first MEMS die.

19 Claims, 2 Drawing Sheets

(56) References Cited

U.S. PATENT DOCUMENTS

| | | | |
|---|---|---|---|
| 8,310,050 B2 | 11/2012 | Chen et al. | |
| 8,315,793 B2* | 11/2012 | Withanawasam | B81B 7/02 701/400 |
| 8,429,969 B2* | 4/2013 | Yamanaka | B81B 7/02 73/493 |
| 8,438,718 B2* | 5/2013 | Aono | G01C 19/56 257/666 |
| 9,108,841 B1* | 8/2015 | Bowles | H01L 25/50 |
| 9,463,976 B2* | 10/2016 | Steimle | B81C 1/00238 |
| 9,499,397 B2* | 11/2016 | Bowles | B81B 7/02 |
| 9,638,524 B2* | 5/2017 | Feyh | G01C 19/5712 |
| 2004/0140475 A1* | 7/2004 | Sun | B81C 1/00269 257/100 |
| 2005/0224257 A1* | 10/2005 | Ekseth | E21B 47/022 175/45 |
| 2008/0248613 A1* | 10/2008 | Chen | B81B 3/0005 438/115 |
| 2009/0183568 A1* | 7/2009 | Yamanaka | G01C 19/5719 73/504.04 |
| 2010/0025845 A1* | 2/2010 | Merz | B81B 7/0038 257/723 |
| 2010/0028618 A1 | 2/2010 | Gonska et al. | |
| 2010/0242603 A1* | 9/2010 | Miller | B81B 7/02 73/514.32 |
| 2011/0016972 A1* | 1/2011 | Reinert | G01C 19/5783 73/504.12 |
| 2011/0290023 A1* | 12/2011 | Takagi | G01C 19/5783 73/514.32 |
| 2012/0212925 A1 | 8/2012 | Zoellin et al. | |
| 2012/0326248 A1* | 12/2012 | Daneman | B81B 7/02 257/415 |
| 2013/0078753 A1 | 3/2013 | Hayes et al. | |
| 2014/0217566 A1* | 8/2014 | Goida | H01L 23/04 257/676 |
| 2014/0227816 A1* | 8/2014 | Zhang | B81C 1/00333 438/48 |
| 2014/0356989 A1* | 12/2014 | Chen | B81C 99/0045 438/17 |
| 2015/0091153 A1* | 4/2015 | Liu | B81C 1/00293 257/704 |
| 2015/0360936 A1* | 12/2015 | Tayebi | B81C 1/0023 257/369 |
| 2016/0229685 A1* | 8/2016 | Boysel | B81B 7/007 |
| 2017/0044005 A1* | 2/2017 | Bowles | B81B 7/02 |

* cited by examiner

US 9,891,244 B2

MICROELECTRONIC PACKAGES HAVING SPLIT GYROSCOPE STRUCTURES AND METHODS FOR THE FABRICATION THEREOF

TECHNICAL FIELD

Embodiments of the present invention relate generally to microelectronic packaging and, more particularly, to microelectronic packages including gyroscope structures split or divided between at least two Microelectromechanical Systems (MEMS) die, as well as to methods for the fabrication thereof.

BACKGROUND

Microelectronic packages are now commonly produced to include three axis MEMS gyroscopes paired with one or more additional MEMS devices, such as three axis MEMS accelerometers. The transducer structures for the MEMS gyroscope and MEMS accelerometer can be formed on a single MEMS die in, for example, a side-by-side relationship. Alternatively, the MEMS gyroscope and MEMS accelerometer structures can be formed on different MEMS die, which are bonded in a stacked relationship. Such a stacked die configuration can be advantageous in that it enables a significant reduction in the planform dimensions or footprint of the microelectronic package. Nonetheless, an ongoing demand continues to exist for the provision of microelectronic packages, which contain MEMS gyroscopes and possibly additional non-gyroscope MEMS sensors, having ever smaller footprints. It is thus desirable to meet this demand by providing such reduced footprint, gyroscope-containing microelectronic packages. Furthermore, in embodiments wherein the microelectronic package contains least one non-gyroscope MEMS sensor in addition to a MEMS gyroscope, it is desirable if the different MEMS devices could be enclosed in fluidly-isolated cavities containing different pressures to optimize the performance of the particular MEMS device enclosed thereby. It would also be desirable to provide methods for fabricating microelectronic packages having one or more of the foregoing characteristics. Other desirable features and characteristics of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

Figure 1:
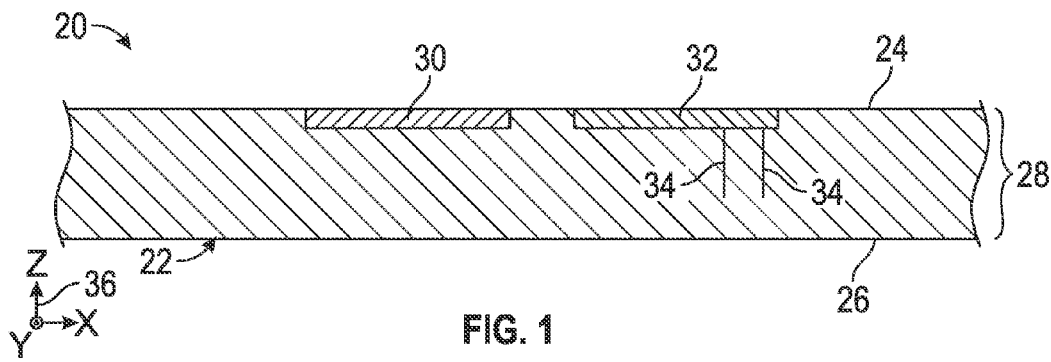
FIGS. 1-5 are simplified cross-sectional views of a microelectronic package shown at various stages of completion and including a gyroscope structure split between stacked MEMS die, as illustrated in accordance with a first embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

The following describes microelectronic packages and methods for fabricating microelectronic packages including MEMS gyroscope structures, which are split or divided between at least two MEMS die. In certain embodiments, the sense axes of the gyroscope structures can align to, for example, provide redundancy or enhanced performance characteristics. It is generally preferred, however, that the sense axes of the MEMS gyroscope structures are mutually exclusive and complementary such that the gyroscope structures collectively provide the functionality of a three axis gyroscope; e.g., one gyroscope structure can be sensitive along the X- and Y-axes, while the other gyroscope structure is sensitive along the Z-axis. Such a "split gyroscope" architecture allows the gyroscope structures to be apportioned between stacked die in a space efficient manner such that the planform dimensions of the microelectronic package are significantly reduced. In many implementations, one of the gyroscope structures (e.g., a gyroscope structure sensitive along the X- and Y-axes) may occupy a greater planform surface area than does the other gyroscope structure (e.g., a gyroscope structure sensitive along the Z-axis). In this case, at least one additional non-gyroscope MEMS sensor, such as a MEMS accelerometer, can further be provided on the MEMS die carrying the small footprint gyroscope structure. By stacking the MEMS die carrying the small footprint gyroscope structure and non-gyroscope MEMS device (which will also typically have smaller footprint than does the large footprint gyroscope structure) on the MEMS die carrying the large footprint gyroscope structure, the overall planform dimensions of the resulting package can be minimized. As a further advantage, embodiments of the below-described microelectronic package enable the MEMS gyroscope structures to be sealed in fluidly-coupled hermetic cavities containing a chosen internal pressure to optimize gyroscope performance. Furthermore, in some embodiments, a separate hermetic cavity can be formed enclosing any non-gyroscope MEMS sensor (e.g., an accelerometer) included within the package. A different pressure can thus be sealed within the separate hermetic cavity and tailored to optimize performance of the non-gyroscope MEMS sensor enclosed thereby.

Embodiments of the below-described microelectronic packages can be produced utilizing a high volume and relatively low cost manufacturing process. Manufacturing can involve processing of at least three wafers: (i) a first MEMS wafer comprised of a first plurality of MEMS die, each carrying a first MEMS gyroscope structure and, perhaps, at least one non-gyroscope MEMS sensor (e.g., an accelerometer); (ii) a second MEMS wafer comprised of a second plurality of MEMS die, each carrying a second MEMS gyroscope structure; and (iii) a cap piece wafer comprised of a number of cap pieces. The wafers are bonded in a stacked relationship to yield a wafer stack. Within the wafer stack, corresponding portions of the MEMS gyroscope structures are enclosed in different hermetic cavities, which are fluidly coupled by a vent hole. In implementations wherein non-gyroscope MEMS sensors (e.g., MEMS accelerometers) are also formed on the first MEMS wafer, each non-gyroscope MEMS sensor can be further enclosed in a hermetic cavity, which is fluidly isolated from the hermetic cavities enclosing the MEMS gyroscope structures. The hermetic cavities can thus be produced to contain different internal pressures tailored to optimize the performance of the particular MEMS device or structure enclosed thereby. Additional processing can be performed after and/or prior to singulation of the wafer stack to yield a plurality of discrete microelectronic packages, each including (amongst other features) a gyroscope structure split between stacked MEMS die. An exemplary embodiment of a fabrication method suitable for producing a number of microelectronic packages having such a "split-gyroscope" architecture will now be described in conjunction with FIGS. 1-5.

FIGS. 1-5 are simplified cross-sectional views of a microelectronic package 20, as shown at various stages of manufacture and produced in accordance with a first exemplary embodiment of the present invention. As shown in FIGS. 1-5 and further described below, package 20 is offered by way of non-limiting example only; it is emphasized that the below-described fabrication process can be utilized to produce microelectronic packages having other structural features. Furthermore, the fabrication steps described below in conjunction with FIGS. 1-5 can be performed in alternative orders, certain steps may be omitted in alternative embodiments, and additional steps may be performed in alternative embodiments. Description of structures and processes known within the microelectronic device and semiconductor industries may be limited or omitted entirely without providing the well-known process details. Referring initially to FIG. 1, microelectronic package 20 includes a MEMS die 22 having a first principal surface or "frontside" 24 and second, opposing principal surface or "backside" 26. At this stage of manufacture, MEMS die 22 remains in wafer form and is integrally joined to number of other non-illustrated MEMS die, which collectively make-up a larger MEMS wafer. A limited portion of the MEMS wafer encompassing MEMS die 22 is shown in FIG. 1 and identified by reference numeral "28." While the following description focuses primarily on the processing of the region of wafer 28 from which microelectronic package 20 is produced, it will be appreciated that the below-described processing steps are generally performed globally across MEMS wafer 28 (and the other wafers utilized in the production of microelectronic package 20) to fabricate a number of other microelectronic packages in parallel with package 20.

A first MEMS gyroscope structure 30 is formed on frontside 24 of MEMS die 22. One or more non-gyroscope MEMS sensors, such as MEMS sensor 32, can also be formed on frontside 24 of MEMS die 22. MEMS gyroscope structure 30 and non-gyroscope MEMS sensor 32 are preferably formed in relatively close proximity in, for example, a side-by-side or laterally adjacent relationship. In preferred embodiments, non-gyroscope MEMS sensor 32 is a multi-axis MEMS accelerometer. However, in further embodiments, MEMS sensor 32 can assume other forms including, for example, that of a magnetometer or pressure sensor. In still further embodiments, MEMS die 22 can carry multiple non-gyroscope MEMS sensors or, conversely, may not have any non-gyroscope MEMS sensors formed thereon. In one particularly useful (albeit non-limiting) implementation, MEMS gyroscope structure 30 is a gyroscopic transducer structure sensitive along an axis orthogonal to MEMS die 22 or parallel to the centerline of package 20 (corresponding to the Z-axis identified by coordinate legend 36 in FIG. 1), while non-gyroscope MEMS sensor 32 is a three axis accelerometer having a Z-sense axis aligned to the Z-sense axis of gyroscope structure 30. While generically illustrated as having substantially equivalent widths in FIG. 1, it will be appreciated that the figures are not drawn to scale and that the relative dimensions of gyroscope structure 30 and MEMS sensor 32 may vary amongst embodiments. Die layout will also vary amongst embodiments; however, MEMS gyroscope structure 30 and MEMS sensor 32 are conveniently formed on different halves or neighboring portions of MEMS die 22, as generally shown in FIG. 1.

In the illustrated embodiment shown in FIG. 1, a number of Through Substrate Vias (TSVs) 34 are formed at selection locations through MEMS die 22. TSVs 34 allow signal communication between electrically-conductive structures, such as circuitry and/or routing features, formed on frontside 24 and opposing backside 26 of MEMS die 22. Furthermore, in embodiments wherein MEMS die 22 is the uppermost or lowermost die in the die stack (as opposed to the intermediate die as is the case in the present example), TSVs 34 can allow signal communication to an Input/Output (I/O) interface later produced over backside 26 of MEMS die 22. Although TSVs 34 are shown to be formed only partially through the thickness of MEMS wafer 28, TSVs 34 alternatively may be formed all the way through the thickness of MEMS wafer 28. In further embodiments, other interconnect features (e.g., wire bonds or electrically-conductive traces deposited onto the sidewalls of package 20) can be utilized to provide electrical communication between the circuitry of MEMS die 22 and any subsequently-formed I/O interface. The formation of TSVs 34 through MEMS die 22 (and the formation of TSVs through the below-described second MEMS die and/or cap piece) may, however, facilitate interconnection during the wafer stacking process (also described below) and may reduce the overall planform dimensions of package 20 by eliminating the need for bond pads shelves, saw-to-reveal manufacturing steps, and other such processes and features often associated with wire bonding. In still further embodiments, microelectronic package 20 may not be produced to include an externally-accessible I/O interface and may instead communicate wirelessly utilizing, for example, a radio frequency (RF) antenna structure.

Figure 2:
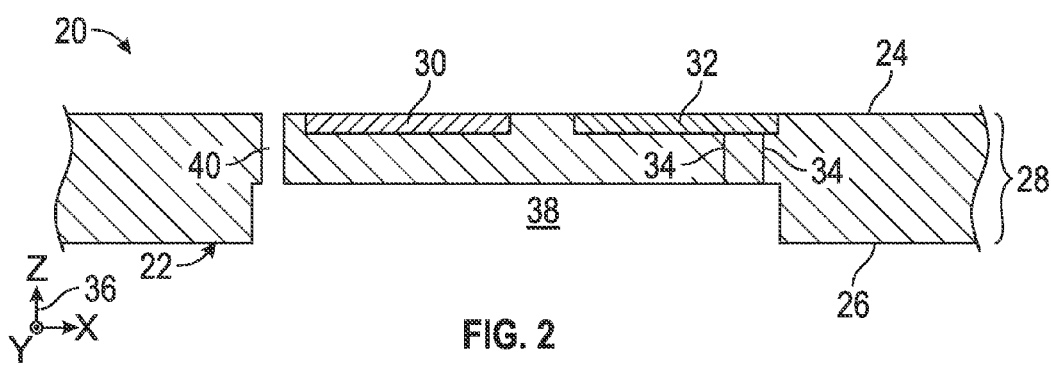

Turning to FIG. 2, a cavity or recess 38 is next formed in backside 26 of MEMS die 22. As are many of the features described in the context of the present example, recess 38 is not necessary in all embodiments of package 20, but is advantageously formed in the region of die 22 that will later help define the hermetic cavity enclosing the second, larger MEMS gyroscope structure (e.g., MEMS gyroscope structure 64 described below in conjunction with FIGS. 4 and 5). In this manner, the hermetic cavity enclosing the second cavity MEMS gyroscope structure can be enlarged, which can be beneficial when a relatively low pressure (e.g., a near vacuum pressure) is sealed within the hermetic cavity, as further described below. An orifice or vent hole 40 is also formed through the body of die 22 to provide a channel or conduit fluidly coupling the frontside 24 and backside 26 of MEMS die 22. Specifically, vent hole 40 extends from recess 38 (or from backside 26 of die 22 if recess 38 is not present)

to frontside 24 of MEMS die 22 at a location adjacent gyroscope structure 30. Vent hole 40 can be drilled, etched, or otherwise formed in MEMS die 22 during wafer level processing of MEMS wafer 28. Recess 38 can likewise be etched into backside 26 of die 22 prior to or after formation of vent hole 40. Additional vent holes and recesses are likewise formed across MEMS wafer 28 at locations corresponding to the other, non-illustrated MEMS die.

Figure 3:
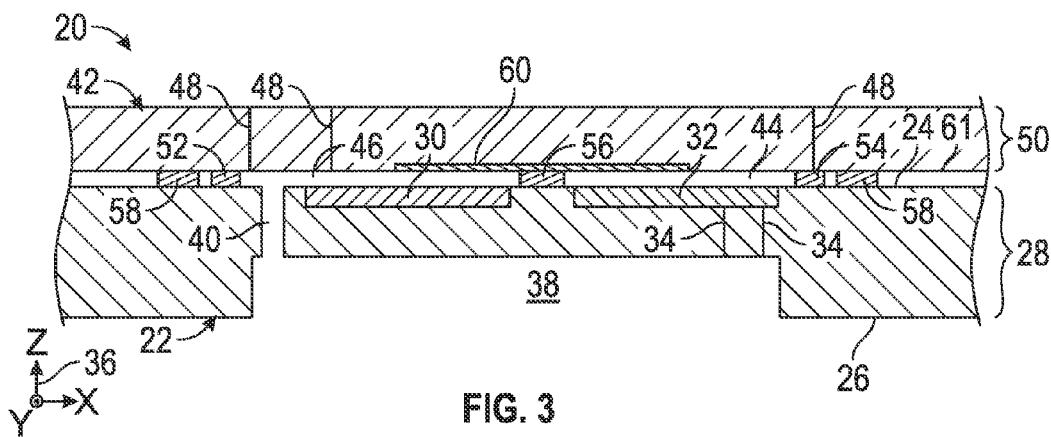

Next, as shown in FIG. 3, a cap piece 42 is bonded to frontside 24 of MEMS die 22. Cap piece 42 cooperates or combines with MEMS die 22 to define a first hermetically-sealed MEMS cavity 44, which encloses non-gyroscope MEMS sensor 32. Cap piece 42 and MEMS die 22 also define, in substantial part, a second MEMS cavity 46 enclosing MEMS gyroscope structure 30. MEMS cavity 44 is hermetically sealed when cap piece 42 is bonded to MEMS die 22 such that a desired internal pressure can be captured within cavity 44 by controlling the process conditions at which bonding is carried-out. In embodiments wherein non-gyroscope MEMS sensor 32 is an accelerometer, the pressure sealed within hermetic cavity 44 is preferably between about 0.5 and about 4 atmosphere (atm) and, more preferably, between about 0.5 and about 1.5 atm; the term "about," as appearing herein, denoting a disparity of less than 10%. In further embodiments, a higher or lower pressure can be sealed within hermetic cavity 44. Once again, a number of TSVs 48 may be formed through cap piece 42 to provide signal communication between the opposing principal surfaces thereof.

At the juncture of manufacture shown in FIG. 3, cap piece 42 is preferably in wafer form and remains an integral part of a larger cap piece wafer 50 (partially shown). Thus, during production of package 20 and the other packages produced in parallel therewith, cap piece wafer 50 is positioned over and bonded to MEMS wafer 28 containing MEMS die 22. Cap piece wafer 50 further includes a number of other non-illustrated cap pieces, which are positioned over the other non-illustrated MEMS die included within MEMS wafer 28 when wafers 28 and 50 are properly aligned. Prior to bonding to MEMS wafer 28, cap piece wafer 50 may undergo wafer level processing to produce any desired features thereon. For example, as indicated above, cap piece wafer 50 can be processed to produce a number of TSVs 48 therethrough. Additionally, in embodiments wherein cap piece 42 and the other cap pieces making-up wafer 50 are smart (that is, carry circuitry or active devices), a number of Application Specific Integrated Circuits (ASICs) 60 can be formed at selected locations across the active principal surface or frontside of cap piece wafer 50. As generically illustrated in FIG. 3, one such ASIC 60 can be formed on inner surface 61 of cap piece 42 bonded to MEMS die 22. ASIC 60 may thus face MEMS die 22 and, perhaps, be exposed to the pressures contained within either or both of hermetic cavities 44 and 46. By eliminating the need for a separate ASIC die through the usage of such a "smart cap," further reductions in size and cost of microelectronic package 20 can be realized. When bonded in the above-described manner, MEMS wafer 28 and cap piece wafer 50 combine to yield a two wafer stack 28, 50.

Bonding material may be utilized to bond cap piece wafer 50 to MEMS wafer 28 and, more specifically, to bond cap piece 42 to MEMS die 22. The bonding material can be deposited as rings (referred to herein as "seal rings") circumscribing or extending around the MEMS structures formed on MEMS wafer 28. With respect to partially-completed package 20, specifically, bonding material is deposited around the perimeters of cavities 44 and 46 to form two seal rings: (i) a first seal ring 52, which extends around MEMS cavity 44 and MEMS gyroscope structure 30, as taken along an axis orthogonal to frontside 24 of MEMS die 22 (the Z-axis identified by coordinate legend 36), and (ii) a second seal ring 54, which extends around MEMS cavity 46 and non-gyroscope MEMS sensor 32, as taken along the Z-axis. While shown in cross-section in FIG. 3, it will be appreciated that seal rings 52 and 54 each form a continuous 360° seal and may have a generally rectangular, square, circular, or other planform geometry. Seal rings 52 and 54 may (but need not always) include a shared portion 56, which serves as an intermediate wall partitioning neighboring hermetic cavities 44 and 46. Additional seal rings may likewise be deposited around the various other MEMS transducer structures formed on the non-illustrated portions of MEMS wafer 28 and included within the microelectronic packages produced in parallel with package 20.

Any material suitable for creating a hermetic or gas-tight seal can be utilized to form seal rings 52 and 54 and the other non-illustrated seal rings deposited between MEMS wafer 28 and cap piece wafer 50. A non-exhaustive list of suitable bonding materials includes aluminum-germanium alloys, copper, and copper alloys, which can be plated onto or otherwise deposited over selected regions of wafer 28 and/or wafer 50 prior to bonding. After deposition of seal rings 52 and 54 at the desired locations, a bonding process may be performed during which wafers 28 and 50 (and, more specifically, MEMS die 22 and cap piece 42) are subject to convergent pressures and elevated temperatures sufficient to form the desired seals. The bonding process is preferably carried-out at a controlled pressure to impart fully-enclosed MEMS cavity 44 and the other non-illustrated, fully-enclosed cavities with a desired internal pressure. The pressure at which the bonding process is carried-out may be greater the desired pressure within cavity 44 if the bonding process is performed under elevated temperature conditions. To provide a non-limiting example, if it is desired for the pressure within MEMS cavity 44 to be approximately 1 atm (as may be the case when non-gyroscope MEMS sensor 32 is an accelerometer), the bonding process may be carried-out at a pressure of about 2-4 atm and at an elevated temperature such that the desired pressure is achieved within cavity 44 upon cooling of microelectronic package 20. Air, nitrogen, or another inert gas can be sealed within cavity 44 during the bonding process. In contrast, MEMS cavity 46 is vented to the surrounding pressure during the bonding process by vent hole 40.

Electrically-conductive bodies may further be deposited at selected locations between cap piece wafer 50 and MEMS wafer 28 to provide electrical interconnections between MEMS die their corresponding cap pieces. Two such electrically-conducive bodies 58 are shown in FIG. 3. Electrically-conducive bodies 58 can interconnect one or more electrically-conductive routing features exposed on frontside 24 of MEMS die 22 (e.g., a first TSV or interconnect line) with one or more electrically-conductive routing features provided on the inner surface of cap piece 42 (e.g., a second, aligning TSV or interconnect line). In embodiments wherein the bonding material utilized to join MEMS wafer 28 and cap piece wafer 50 (and, therefore, MEMS die 22 and cap piece 42) is electrically conductive, electrically-conductive bodies 58 can be formed in conjunction with seal rings 52 and 54 by plating or otherwise depositing discrete columns, globs, or lines of the electrically-conducive bonding material on selected areas of wafers 28 and 50 prior to wafer bonding. Electrical interconnection can also be provided through seal rings 52 and 54, if desired.

Figure 4:
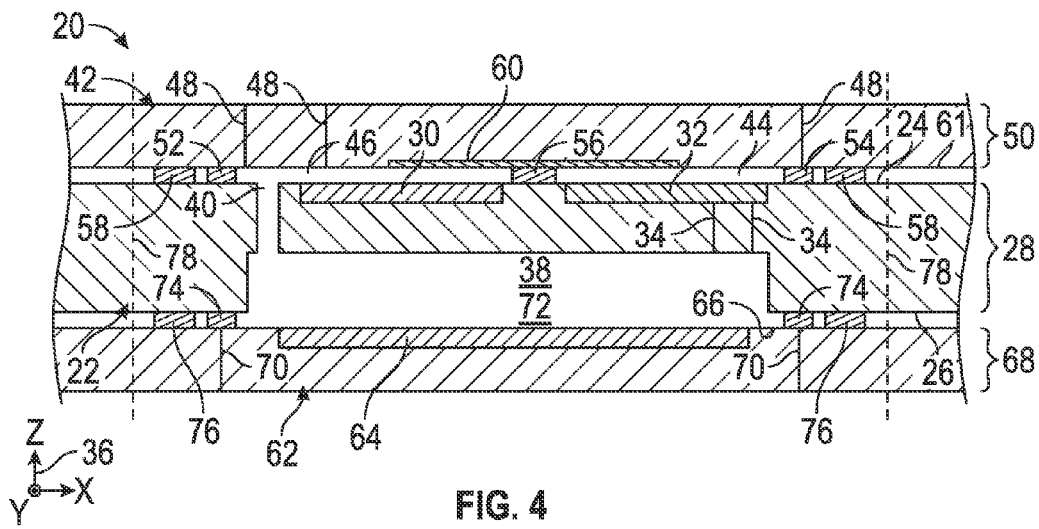

Advancing to FIG. 4, a second MEMS die 62 is next bonded to backside 26 of MEMS die 22 opposite cap piece 42. A second MEMS gyroscope structure 64 is formed on frontside 66 of die 62, which is bonded to and thus faces backside 26 of MEMS die 22. MEMS die 62 is included within a larger MEMS wafer 68. While only a limited portion of MEMS wafer 68 is shown in FIG. 4, it will be appreciated that MEMS wafer 68 includes additional non-singulated MEMS die utilized in the production of the other non-illustrated packages manufactured in parallel with package 20. Thus, from a wafer level perspective, MEMS wafer 68 is bonded to MEMS wafer 28 to yield a three wafer stack 28, 50, 68 comprised of MEMS wafer 28, cap piece wafer 50, and MEMS wafer 68. Prior to bonding to MEMS wafer 28, MEMS wafer 68 is processed to produce MEMS gyroscope structure 64 and the additional non-illustrated MEMS gyroscope structures thereon. Various other routing features, circuitry, and/or devices can also be produced on MEMS wafer 68 including, for example, TSVs 70.

An additional hermetic MEMS cavity 72 is formed when MEMS die 62 is bonded to MEMS die 22 and, more generally, when MEMS wafer 68 is bonded to MEMS wafer 28. In particular, as shown in FIG. 4, backside 26 of MEMS die 22, frontside 66 of MEMS die 62, and recess 38 (when present) cooperate to define hermetically-sealed cavity 72, which sealingly encloses MEMS gyroscope structure 64. Once again, a seal ring 74 can be plated or otherwise deposited onto MEMS die 22 or MEMS die 62 prior to wafer-to-wafer bonding, along with one or more electrically-conductive interconnect features 76. Seal ring 74 circumscribes or surrounds hermetic cavity 72 and MEMS gyroscope structure 64, as taken along an axis orthogonal to die 62 (corresponding to the Z-axis in FIG. 4). Seal ring 74 can be produced in essentially the same manner and from the same type of materials are as seal rings 52 and 54 described above in conjunction with FIG. 3. It may be beneficial, however, to produce seal ring 74 from a bonding material having a lower bonding temperature than does the bonding material from which seal rings 52 and 54 are produced. In this way, processing conditions can be controlled to reduce the likelihood of undesirable reflow of seal rings 52 and 54 during bonding of MEMS wafers 28 and 68. Additional seal rings and interconnect features are also likewise formed across MEMS wafer 28 and/or MEMS wafer 68 prior to wafer bonding and the production of three wafer stack 28, 50, 68.

In addition to enclosing MEMS gyroscope structure 64 within hermetically-sealed cavity 72, bonding of MEMS die 22 and 62 (and, more generally, bonding of MEMS wafers 28 and 68) results in sealing of MEMS cavity 46. In particular, when bonded to MEMS die 28, MEMS die 62 covers vent hole 40 (as viewed from the exterior of wafer stack 28, 50, 68) and thereby seals MEMS cavity 46 from the ambient environment. MEMS cavity 46 remains fluidly coupled to MEMS cavity 72, however, by vent hole 40. By controlling the process conditions under which MEMS die 22 and 62 (and, more generally, MEMS wafers 28 and 68) are bonded, a common known pressure can be trapped within MEMS cavities 46 and 72. It is thus possible to select the known pressure to optimize performance of MEMS gyroscope structures 30 and 64. In many cases, the known pressure contained within MEMS cavities 46 and 72 will be relatively low and less than the known pressure contained within MEMS cavity 44 (when present). In one embodiment, cavities 46 and 72 can be sealed to contain a pressure near vacuum, such as a pressure less than about 1 torr and, more preferably, less than about 0.5 torr. In other embodiments, a greater pressure can be captured within MEMS cavities 44 and 68. As indicated above, air, nitrogen, or another inert gas may be sealed within hermetic cavities 44 and 72 at the desired pressure. Once again, bonding of MEMS wafers 28 and 68 can be carried-out at elevated pressures and temperatures such that the desired pressure is achieved within MEMS cavities 44 and 72 post-bonding, after cooling of package 20 and the other packages produced in parallel therewith.

In preferred embodiments, MEMS gyroscope structure 30 and MEMS gyroscope structure 64 have different, but complementary sense axes such that structures 30 and 64 collectively function as a three axis gyroscope. In this case, MEMS gyroscope structure 30 can be sensitive along a first sense axis orthogonal to MEMS die 22 and 62 (e.g., the Z-axis identified in FIG. 4), while MEMS gyroscope structure 64 is sensitive along second and third sense axes orthogonal to the first sense axis (e.g., the X- and Y-axes). In such embodiments, and as generally indicated in FIG. 4, MEMS gyroscope structure 64 may occupy a planform surface area or footprint that is considerably larger (e.g., approximately twice the size) than the footprint of MEMS gyroscope structure 30. Similarly, the planform dimensions of gyroscope structure 64 (e.g., the width and length of structure 64, as taken along the X- and Y-axes, respectively) can exceed the planform dimensions of gyroscope structure 30. Thus, by forming gyroscope structures 30 and 64 on different stacked die such that structures 30 and 64 overlap axially (that is, overlap as taken along the Z-axis), the planform dimensions of microelectronic package 20 can be minimized. Furthermore, non-gyroscope MEMS sensor 32 can also occupy a planform surface area less than that occupied by larger gyroscope structure 64. Thus, when produced to include non-gyroscope MEMS sensor 32 (or another small footprint, non-gyroscope MEMS sensor), additional reduction in the planform dimensions of package 20 can be achieved by positioning the MEMS sensor 32 adjacent small footprint gyroscope structure 30 at a position axially overlapping with gyroscope structure 64.

While microelectronic package 20 remains incomplete at the stage of manufacture shown in FIG. 4, it will be appreciated that significant reduction in the planform dimensions of package 20 have already been achieved by virtue of the above-described split gyroscope package architecture. In embodiments wherein stacked die 22 and 62 cooperate to provide the functionality of a three axis gyroscope, the split gyroscope design of microelectronic package 20 should be contrasted with conventional packages having stacked die architectures. In such conventional stacked die packages, a three axis gyroscope and a three axis accelerometer are commonly formed on different MEMS dies. By inherent design, the accelerometer typically has a footprint considerably smaller than the footprint of the gyroscope. As the planform dimensions of the stacked die are typically equivalent or near equivalent, a significant area of the die carrying the accelerometer often remains unused or unexploited. By comparison, in the case of exemplary microelectronic package 20 shown in FIG. 4, unexploited die area is greatly reduced by positioning the small footprint gyroscope structure 30 (e.g., a Z-axis gyroscope transducer) adjacent the small footprint non-gyroscope MEMS sensor 32 (e.g., a three axis accelerometer) such that both structure 30 and sensor 32 are positioned over or axially overlapping with the large footprint gyroscope structure 64 (e.g., an X-/Y-axis gyroscope transducer). As a result, the overall planform dimensions of package 20 are reduced, throughput can be increased, and manufacturing costs can be lowered. The instant example notwithstanding, the sense axes of gyroscope structures 30 and 64 may align in further embodiments. For example, in certain embodiments, gyroscopic structures 30 and 64 can be produced as three axis MEMS gyroscopes having aligning X-, Y-, and Z-sense axes. Such an embodiment may be especially useful when MEMS gyroscope structures 30 and 64 are produced to have different sensitivities such that the gyroscope structures are capable of measuring movement over a wide range of rotational rates.

Figure 5:
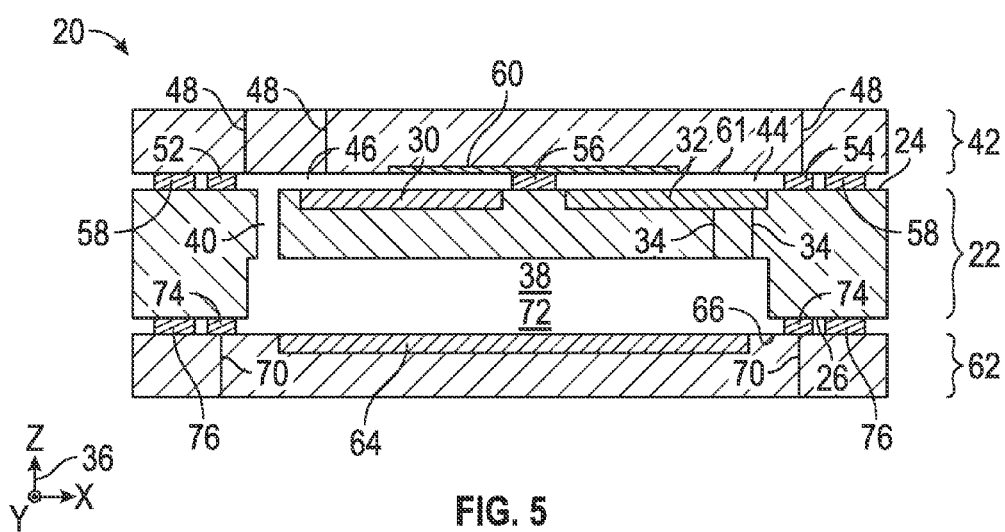

Conventional processing steps may now be performed to complete fabrication of microelectronic package 20 and the other packages produced from wafer stack 28, 50, 68. Amongst other processes, wafer stack 28, 50, 68 is singulated (indicated in FIG. 4 by dashed lines 78) to yield a plurality of microelectronic packages including package 20. The resultant structure is shown in FIG. 5. Prior to or after singulation of wafer stack 28, 50, 68 various different features or structures, including Redistribution Layers (RDLs) and one or more contact arrays (e.g., a Ball Grid Array or "BGA"), can be produced over the externally-exposed surfaces of package 20. The particular processing steps will vary depending whether a Fan-In Wafer Level Packaging (FI-WLP) approach, a Fan-Out Wafer Level Packaging (FO-WLP) approach, or another packaging approach is employed. In embodiments wherein an FO-WLP approach is employed, package 20 (FIG. 5) and a number of packages can be embedded within a molded panel, which undergoes further processing to produce a number of fan-out wafer level packages. Additional microelectronic devices (e.g., circuit-carrying die) and/or additional MEMS sensors (e.g., a three axis magnetometer) can be integrated into microelectronic package 20, as desired. Such features and processing steps are conventionally known and will vary amongst embodiments depending upon the particular design and functionality of package 20.

The foregoing has thus provided an exemplary embodiment of a fabrication method suitable for producing microelectronic packages containing MEMS gyroscope structures, which are split or divided between first and second stacked MEMS die. The MEMS gyroscope structures are advantageously enclosed in hermetic cavities, which contain a predetermined pressure tailored to optimize performance of the gyroscope structures. As described above, the hermetic cavities can be fluidly coupled by a vent hole utilized to vent the hermetic cavity enclosing the first MEMS gyroscope structure during bonding of the first MEMS die to a cap piece and, perhaps, while a predetermined pressure is captured within an additional hermetic cavity enclosing a non-gyroscope MEMS sensor (e.g., an accelerometer) also carried by the first MEMS die. In the above-described exemplary embodiment, the hermetic cavity enclosing the first MEMS gyroscope structure is axially bound by or formed between the cap piece and the first MEMS die, while the hermetic cavity enclosing the second MEMS gyroscope structure is axially bound by or formed between the first and second MEMS die. However, this need not be the case in all embodiments. Furthermore, while formed through the first MEMS die in the above-described example, the vent hole can be formed through other structures, such as the cap piece, in further embodiments. To further emphasize this point, an additional exemplary embodiment of a split gyroscope microelectronic package will now be described in conjunction with FIG. 6.

Figure 6:
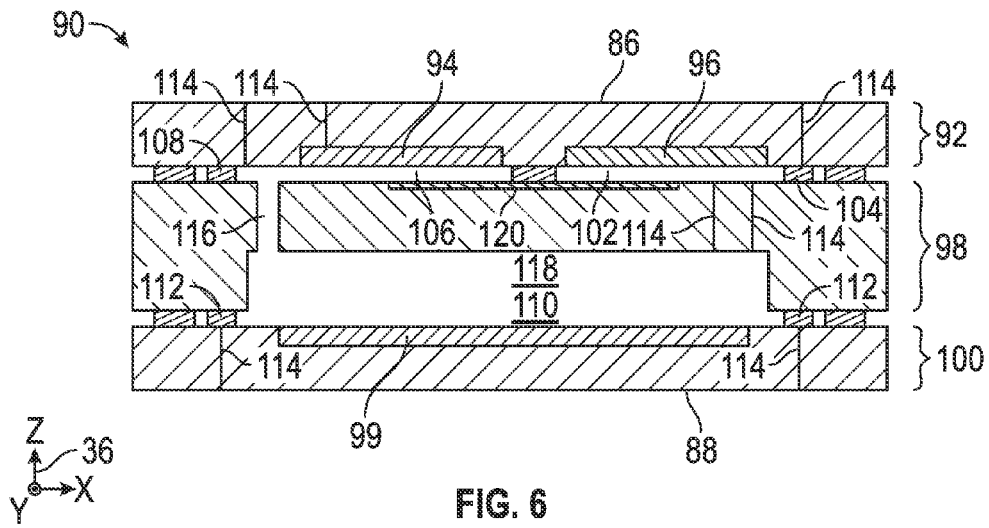
FIG. 6 is a simplified cross-sectional view of a microelectronic package including a gyroscope structure split between stacked MEMS die, as illustrated in accordance with a first embodiment of the present invention.

FIG. 6 is a simplified cross-sectional view of a split gyroscope microelectronic package 90, as illustrated in accordance with a further exemplary embodiment of the present invention. As will readily be appreciated by one of skill in the relevant field, microelectronic package 90 is shown in a partially-completed state in FIG. 6 and will include various additional, non-illustrated features when completed; e.g., contact arrays, redistribution layers, heat sinks, electromagnetic or RF interference shields, RF antenna structures, and/or the like can be formed over one or both of opposing principal surfaces 86 and 88 of microelectronic package 90. Such features are, however, conventionally known and are consequently not shown in FIG. 6 to avoid unnecessarily obscuring the various inventive features of microelectronic package 90, as described below. More generally, embodiments of microelectronic packages 90 may include only two or more MEMS gyroscope structures formed on different die, which are bonded, directly or indirectly, in a stacked relationship. In further embodiments, microelectronic package 90 can include various additional sensors (e.g., any combination of accelerometers, magnetometers, pressure sensors, temperature sensors, altitude sensors, and so on) to impart the package with additional degrees of freedom.

In many respects, microelectronic package 90 is similar to package 20 described above in conjunction with FIGS. 1-5. For example, package 90 includes a MEMS die 92 having a first MEMS gyroscope structure 94 (e.g., a Z-axis gyroscope transducer) and a non-gyroscope MEMS sensor 96 (e.g., an accelerometer) formed thereon. A cap piece 98 is bonded to the frontside of die 92 on which MEMS transducer structures 94 and 96 are located, and a second MEMS die 100 is bonded to cap piece 98 opposite MEMS die 92. A second MEMS gyroscope structure 99 (e.g., an X-/Y-axis gyroscope transducer) is formed on the frontside of MEMS die 100, which is bonded to cap piece 98. A first hermetic cavity 102 sealingly encloses non-gyroscope MEMS sensor 96 and is defined or bound by die 92, a seal ring 104, and intervening cap piece 98. Similarly, a second hermetic cavity 106 sealingly encloses MEMS gyroscope structure 94 and is defined or bound by die 92, a seal ring 108, and cap piece 98. Finally, a third hermetic cavity 110 sealingly encloses MEMS gyroscope structure 99 and is defined or bound by MEMS die 100, a seal ring 112, and cap piece 98. A vent hole 116 is formed through cap piece 98 to fluidly couple MEMS cavities 106 and 110. If desired, a recess 118 can be produced in the surface of cap piece 98 bonded to MEMS die 100 to enlarge the volume of MEMS cavity 110 and, therefore, the collective volume of fluidly-coupled cavities 106 and 110. Furthermore, an ASIC 120 can be formed on intervening cap piece 98, if desired; and TSVs 114 can optionally be formed through MEMS die 92, cap piece 98, and/or MEMS die 100, as appropriate, to complete the desired wiring structure of package 90.

Microelectronic package 90 can be produced in a manner similar to that described above in conjunction with package 20 (FIGS. 1-5). During fabrication of package 90, cap piece 98 (as included in a larger cap piece wafer) can first be bonded to MEMS die 92 (as included in a larger MEMS wafer) to seal a first desired pressure within cavity 102, while cavity 106 remains vented to the surrounding atmosphere or ambient environment. MEMS die 100 (as included in a larger MEMS wafer) may then be bonded over cap piece 98 to seal vent hole 116 and thereby seal a second desired pressure within fluidly coupled MEMS cavities 106 and 110. The pressures sealed within hermetic cavities 102, 106, and 110 may thus be selected to best suit the particular MEMS transducer structures enclosed thereby. The wafer stack can then be singulated and additional processing performed, prior to and/or after wafer stack singulation, to complete fabrication of package 90. As shown in FIG. 6, the resulting package 90 includes a MEMS gyroscope structure 94, which has a smaller footprint than does MEMS gyroscope structure 99 and which axially overlaps with gyroscope structure 99, as taken along an axis orthogonal to die 92 and die 100 (corresponding to the Z-axis in FIG. 6). Additionally, inverted MEMS die 92 also carries a non-gyroscope MEMS sensor 96, which is disposed laterally adjacent MEMS gyroscope structure 94. MEMS sensor 96 also has a smaller footprint than does MEMS gyroscope structure 99, and likewise axially overlaps with gyroscope structure 99. The planform dimensions of MEMS-containing package 90 are thus favorably reduced by virtue of this unique split gyroscope architecture.

There have thus been provided multiple exemplary embodiments of a microelectronic package including MEMS gyroscope structures, which are split or divided between at least two MEMS die. In certain embodiments, the MEMS gyroscope structures combined to effectively yield a three axis gyroscope, which has been divided into two structures: (i) a first MEMS gyroscope structure, which provides sensing along at least one axis (e.g., the X- and Y-axes), and (ii) a second MEMS gyroscope structure, which provides a sense axis orthogonal to the axis or axes of the first MEMS gyroscope structure (e.g., the Z-axis). As described above, such an approach allows the surface area of the gyroscope to be apportioned between stacked die in more efficient manner to reduce the planform dimensions of the microelectronic package. This may be particularly advantageous when, for example, the microelectronic package further includes at least one additional non-gyroscope MEMS sensor, such as a MEMS accelerometer. Embodiments of the above-described microelectronic package can further include fluidly-coupled hermetic cavities, which enclose the MEMS gyroscope structures and which can contain a known pressure selected to optimize gyroscope performance. At the same time, any non-gyroscope MEMS sensor included within the microelectronic package (e.g., an accelerometer) can be sealed within a separate hermetic cavity containing a different pressure tailored to optimized performance of the non-gyroscope MEMS sensor. As a further advantage, embodiments of the above-described microelectronic package can be produced utilizing a high volume, low cost manufacturing process performed, at least in large part, on a wafer level.

In one embodiment, the above-described microelectronic package includes a first MEMS die having a first MEMS gyroscope structure thereon. The microelectronic package further includes second MEMS die, which has a second MEMS gyroscope structure thereon and which is positioned in a stacked relationship with the first MEMS die. The first and second MEMS gyroscope structures overlap as taken along a first axis orthogonal to a principal surface of the first MEMS die. In another embodiment, the microelectronic package includes a first MEMS die having a first MEMS gyroscope structure and a MEMS accelerometer formed thereon. A second MEMS die having a second MEMS gyroscope structure thereon is positioned in a stacked relationship with the first MEMS die. A first hermetic cavity encloses the first MEMS gyroscope structure and contains a first predetermined pressure. Similarly, a second hermetic cavity encloses the second MEMS gyroscope structure, is fluidly coupled to the first hermetic cavity, and also contains the first predetermined pressure. Finally, a third hermetic cavity encloses the MEMS accelerometer and contains a second predetermined pressure greater than the first predetermined pressure.

Embodiments of a method for fabrication microelectronic packages having split gyroscope structures have also been provided. In one embodiment, the method includes the step or process of obtaining, whether by independent fabrication or purchase from a supplier, a first MEMS wafer comprised of a first plurality of MEMS die, each having a first MEMS gyroscope structure thereon. The first MEMS wafer is positioned over a second MEMS wafer comprised of a second plurality of MEMS die, each having a second MEMS gyroscope structure thereon. The first and second MEMS wafers are bonded to produce a multi-wafer stack. The multi-wafer stack is then singulated to produce a plurality of microelectronic packages each including first and second MEMS gyroscope structures carried by first and second MEMS die, respectively. In certain embodiments, the first MEMS wafer is positioned over and bonded to the second MEMS wafer such that, for each of the plurality of microelectronic packages produced by singulation of the multi-wafer stack, the first and second MEMS gyroscope structures overlap as taken along an axis orthogonal to principal surfaces of the first and second MEMS die. In other embodiments, the step or process of bonding may entail bonding the first MEMS wafer, the second MEMS wafer, and a cap piece wafer in a stacked relationship to produce the multi-wafer stack. In this case, each microelectronic package produced by singulation of the multi-wafer stack may further include a cap piece bonded to the first MEMS die. The first MEMs wafer, the second MEMS wafer, and the cap piece wafer are further advantageously bonded such that the first and second MEMS gyroscope structures are enclosed by first and second hermetic cavities, respectively.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It should be understood that various changes may be made in the function and arrangement of elements described in an exemplary embodiment without departing from the scope of the invention as set-forth in the appended claims.

As appearing herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, MEMS devices, passive electronic components (e.g., a discrete resistor, capacitor, inductor, or diode), optical devices, and other small scale electronic devices capable of providing processing, memory, sensing, radio frequency, optical, and actuator functionalities, to list but a few examples. The term "wafer" is utilized to encompass bulk semiconductor (e.g., silicon) wafers, layered structures (e.g., silicon-on-insulator substrates), and other structures over which number of semiconductor devices, MEMS devices, or the like can be produced utilizing global or wafer-level processing techniques. The term "die" is utilized in reference to a singulated piece of a wafer on which one or more integrated circuits, MEMS devices, and/or another microelectronic component has been fabricated via wafer-level processing of the wafer. Finally, as still further appearing herein, the phrase "produced on," the phrase "fabrication on," and the like encompass the terms "over" and "in" such that a device "fabricated on" a semiconductor wafer may be produced over a principal surface thereof, in the body of the wafer, or a combination thereof.

What is claimed is:

1. A microelectronic package, comprising:
   a first Microelectromechanical Systems (MEMS) die having a first MEMS gyroscope structure and a frontside on which the first MEMS gyroscope structure is formed;
   a second MEMS die having a second MEMS gyroscope structure thereon and positioned in a stacked relationship with the first MEMS die, the first and second MEMS gyroscope structures overlapping as taken along an axis orthogonal to the frontside of the first MEMS die;
   a first hermetic cavity enclosing the first MEMS gyroscope structure;
   a second hermetic cavity enclosing the second MEMS gyroscope structure and fluidly coupled to the first hermetic cavity;
   a vent hole fluidly coupling the first and second hermetic cavities and formed through the first MEMS die;
   a cap piece sealingly bonded to the first MEMS die opposite the second MEMS die; and
   a MEMS accelerometer structure formed on the frontside of the first MEMS die at a location adjacent the first MEMS gyroscope structure, the MEMS accelerometer structure further overlapping with the second MEMS gyroscope structure as taken along an axis orthogonal to the frontside of the first MEMS die.

2. The microelectronic package of claim 1 wherein the first and second MEMS gyroscope structures are sensitive along mutually exclusive, orthogonal axes such that the first and second MEMS gyroscope structures collectively provide the functionality of a three axis gyroscope.

3. The microelectronic package of claim 2 wherein the first MEMS gyroscope structure is sensitive along a first sense axis substantially orthogonal to the first MEMS die, and wherein the second gyroscope structure is sensitive along second and third axes orthogonal to the first axis.

4. The microelectronic package of claim 1 wherein a planform surface area of the second MEMS gyroscope structure is greater than a planform surface area of the first MEMS gyroscope structure and greater than a planform surface area of the MEMS accelerometer structure.

5. The microelectronic package of claim 1 wherein the first and second MEMS gyroscope structures are sensitive along at least one common sense axis, and wherein the first MEMS gyroscope structure has sensitivity greater than the sensitivity of the second MEMS gyroscope structure.

6. The microelectronic package of claim 1 wherein the first and second hermetic cavities contain a first pressure, and wherein the microelectronic package further comprises:
   a third hermetic cavity enclosing the MEMS accelerometer structure and containing a second pressure greater than the first pressure.

7. The microelectronic package of claim 1 wherein the first MEMS die, the second MEMS die, and the cap piece comprise singulated pieces of a first MEMS wafer, a second MEMS wafer, and a cap piece wafer, respectively.

8. The microelectronic package of claim 1 wherein the first hermetic cavity is defined, at least in substantial part, by the frontside of the first MEMS die and the cap piece;
   wherein the second hermetic cavity is defined, at least in substantial part, by a backside of the first MEMS die and a frontside of the second MEMS die; and
   wherein the microelectronic package further comprises a third hermetic cavity enclosing the MEMS accelerometer structure and defined, at least in substantial part, by the frontside of the first MEMS die and the cap piece.

9. A microelectronic package, comprising:
   a first Microelectromechanical Systems (MEMS) die having a first MEMS gyroscope structure and a frontside on which the first MEMS gyroscope structure is formed;
   a second MEMS die having a second MEMS gyroscope structure thereon and positioned in a stacked relationship with the first MEMS die, the first and second MEMS gyroscope structures overlapping as taken along an axis orthogonal to the frontside of the first MEMS die;
   a first hermetic cavity enclosing the first MEMS gyroscope structure;
   a second hermetic cavity enclosing the second MEMS gyroscope structure and fluidly coupled to the first hermetic cavity;
   a cap piece sealingly bonded between the first and second MEMS die;
   a vent hole fluidly coupling the first and second hermetic cavities and formed through the cap piece; and
   a MEMS accelerometer formed on the frontside of the first MEMS die at a location adjacent the first MEMS gyroscope structure, the MEMS accelerometer further overlapping with the second MEMS gyroscope structure as taken along an axis orthogonal to the frontside of the first MEMS die.

10. The microelectronic package of claim 9 wherein the first hermetic cavity is defined, at least in substantial part, by the frontside of the first MEMS die and the cap piece;
    wherein the second hermetic cavity is defined, at least in substantial part, by the cap piece and a frontside of the second MEMS die; and
    wherein the microelectronic package further comprises a third hermetic cavity enclosing the MEMS accelerometer structure and defined, at least in substantial part, by the frontside of the first MEMS die and the cap piece.

11. A microelectronic package, comprising:
    a first Microelectromechanical Systems (MEMS) die having a first MEMS gyroscope structure and a MEMS accelerometer formed thereon;
    a second MEMS die having a second MEMS gyroscope structure thereon and positioned in a stacked relationship with the first MEMS die;
    a first hermetic cavity enclosing the first MEMS gyroscope structure and containing a first pressure;
    a second hermetic cavity enclosing the second MEMS gyroscope structure, fluidly coupled to the first hermetic cavity, and containing the first pressure; and
    a third hermetic cavity enclosing the MEMS accelerometer and containing a second pressure greater than the first pressure.

12. The microelectronic package of claim 11 wherein the microelectronic package has a centerline, wherein the first MEMS gyroscope structure is sensitive along a first axis parallel to the centerline, wherein the second MEMS gyroscope structure sensitive along second and third axes orthogonal to the first axis, and wherein the accelerometer is sensitive along the first, second, and third axes.

13. The microelectronic package of claim 11 further comprising:
    a cap piece sealingly bonded to the first MEMS die; and a vent hole fluidly coupling the first and second hermetic cavities and formed through one of the cap piece and the first MEMS die.

14. The microelectronic package of claim 13 further comprising an application specific integrated circuit formed in the cap piece, exposed to the first pressure, and exposed to the second pressure.

15. The microelectronic package of claim 13 further comprising a recess formed in the cap piece and partially defining the second hermetic cavity, the vent hole extending from the recess to a surface of the cap piece to which the first MEMS die is bonded.

16. The microelectronic package of claim 15 further comprising an application specific integrated circuit formed in the cap piece substantially opposite the recess.

17. The microelectronic package of claim 11 further comprising a recess formed in the first MEMS die and partially defining the second hermetic cavity.

18. The microelectronic package of claim 17 wherein the recess is formed in the first MEMS die substantially opposite the first MEMS gyroscope structure and the MEMS accelerometer, the vent hole extending from the recess to a frontside of the first MEMS die on which the first MEMS gyroscope structure and the MEMS accelerometer are formed.

19. The microelectronic package of claim 11 wherein the second MEMS gyroscope structure overlaps with the first MEMS gyroscope structure and with the MEMS accelerometer, as taken along a centerline of the microelectronic package.

* * * * *